US012663441B2

(12) United States Patent
Lee et al.

(10) Patent No.: US 12,663,441 B2
(45) Date of Patent: Jun. 23, 2026

(54) VOLTAGE MEASUREMENT DEVICE

(71) Applicant: Fulian Precision Electronics (Tianjin) Co., LTD., Tianjin (CN)

(72) Inventors: Wei-Ming Lee, New Taipei (TW); Chi-Wen Chen, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 193 days.

(21) Appl. No.: 18/613,380

(22) Filed: Mar. 22, 2024

(65) Prior Publication Data

US 2025/0231221 A1      Jul. 17, 2025

(30) Foreign Application Priority Data

Jan. 17, 2024     (CN) .......................... 202420108339.2

(51) Int. Cl.
G01R 15/00          (2006.01)
G01R 19/00          (2006.01)
(52) U.S. Cl.
CPC ......... G01R 15/00 (2013.01); G01R 19/0084 (2013.01)
(58) Field of Classification Search
CPC ....... G01R 15/00; G01R 19/0084; G01R 1/04
See application file for complete search history.

(56) References Cited

U.S. PATENT DOCUMENTS

| | | | | |
|---|---|---|---|---|
| 4,295,467 | A | * | 10/1981 | Mann ..................... A61B 18/14 |
| | | | | 606/44 |
| 5,834,939 | A | * | 11/1998 | Makhija ................. G01R 15/16 |
| | | | | 324/393 |
| 7,348,785 | B2 | * | 3/2008 | Maxwell ................ G01R 1/067 |
| | | | | 324/754.13 |
| 2006/0216800 | A1 | * | 9/2006 | Ishihara ............... G01R 15/207 |
| | | | | 435/135 |
| 2007/0152657 | A1 | * | 7/2007 | Yabe ....................... G01P 3/487 |
| | | | | 324/174 |
| 2008/0224922 | A1 | * | 9/2008 | Cleland .............. G01R 27/2676 |
| | | | | 342/175 |
| 2013/0030734 | A1 | * | 1/2013 | Ware ...................... G01R 19/00 |
| | | | | 702/62 |
| 2013/0320962 | A1 | * | 12/2013 | Rother ................. G01R 19/155 |
| | | | | 324/149 |
| 2019/0265279 | A1 | * | 8/2019 | Chansavang ........ G01R 22/065 |
| 2022/0291260 | A1 | * | 9/2022 | Osawa .................. G02F 1/2252 |
| 2025/0231222 | A1 | * | 7/2025 | Melzer .................. G01R 15/18 |

* cited by examiner

*Primary Examiner* — Akm Zakaria
(74) *Attorney, Agent, or Firm* — ScienBiziP, P.C.

(57)          ABSTRACT
A voltage measurement device with an expanded applicability is provided. The voltage measurement device includes a housing, a magnetic member, a first probe assembly, and a second probe assembly. By setting the magnetic member within the housing, the voltage measurement device can be magnetically attracted to any position on the busbar of the device to be measured. Additionally, the second probe assembly is movable, enabling voltage measurements on busbars of different thicknesses and devices of different sizes, expanding the applicability of the voltage measurement device.

18 Claims, 9 Drawing Sheets

VOLTAGE MEASUREMENT DEVICE

FIELD

The subject matter herein generally relates to measuring instruments, and more particularly, to a voltage measurement device.

BACKGROUND

Voltage measurement devices are used to measure voltage of electronic circuit. The existing voltage measurement device need to be attached to a fixing position to perform the voltage measurement, making the measurement process inconvenient.

Therefore, there is room for improvement in the art.

BRIEF DESCRIPTION OF THE DRAWINGS

Implementations of the present disclosure will now be described, by way of embodiments only, with reference to the attached figures.

DETAILED DESCRIPTION

Figure 1:
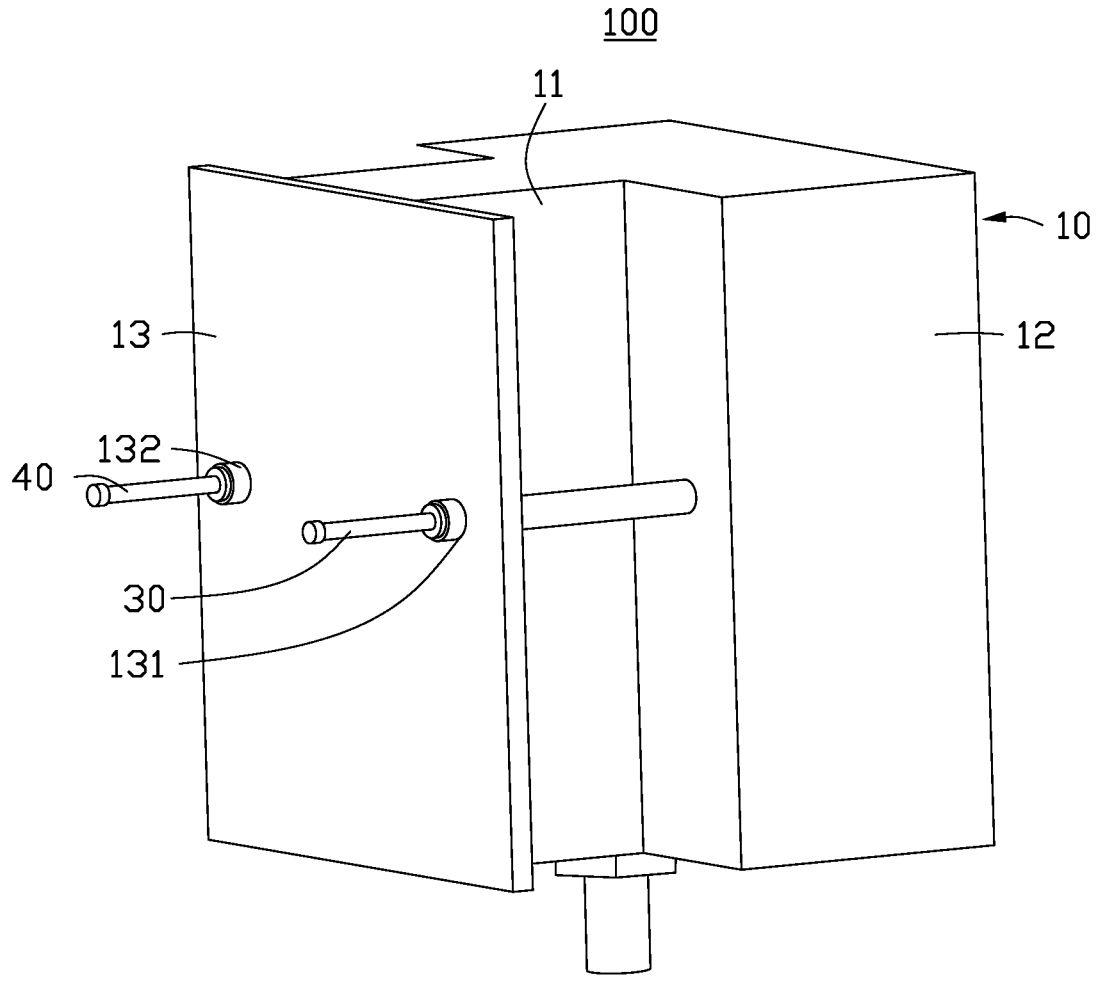
FIG. 1 is a diagrammatic view of an embodiment of a voltage measurement device according to the present disclosure.

Unless otherwise defined, all technical and scientific terms used herein have the same meaning as commonly understood by persons skill in the art. The terms used herein are only for the purpose of describing specific embodiments, and not intended to limit the embodiments of the present application.

It should be noted that all directional indications (such as up, down, left, right, front, back, etc.) in the embodiments of the present application are only used to explain the relative positional relationship or movement between various components under a certain posture (as shown in the drawings). If the specific posture changes, the directional indication also changes accordingly.

It should be noted that when a component is referred to as being "fixed on" or "mounted on" another component, it may be directly on the other component or there may also be an intervening component. When a component is considered to be "set on" another component, it may be in direct contact with the other component or there may also be an intervening component.

In this application, descriptions such as "first", "second" etc. are only used for description purposes and should not be understood as indicating or implying their relative importance or implying the number of indicated technical features. Thus, a feature defined as "first" and "second" may expressly or implicitly include at least one of that feature. In the description of the present application, "plurality" means more than one unless expressly and specifically defined otherwise.

Some embodiments of the present application will be described in detail below with reference to the drawings. The following embodiments and features of the embodiments may be combined with each other in the absence of conflict.

Figure 2:
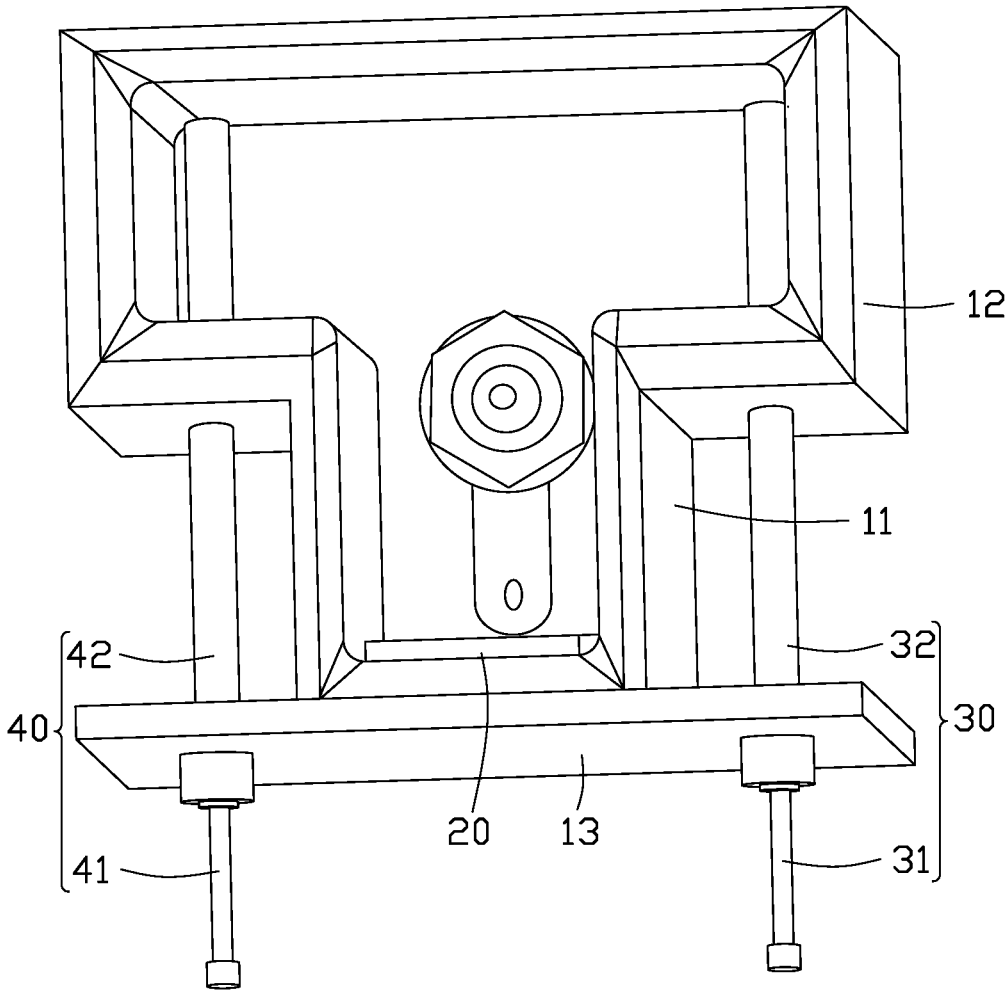
FIG. 2 is a diagrammatic view of an internal structure of the voltage measurement device of FIG. 1.

Referring to FIGS. 1 and 2, an embodiment of the present application provides a voltage measurement device 100, which can be used to measure voltages of a device to be measured (not shown). The voltage measurement device 100 includes a housing 10, a magnetic member 20, a first probe assembly 30, and a second probe assembly 40.

The housing 10 includes a first housing 11, a second housing 12 connected to the first housing 11, and a first cover 13 covering the first housing 11. The first housing 11 is approximately cubic, the second housing 12 is also approximately cubic, and the first cover 13 is approximately rectangular and plate-shaped. The height of the first housing 11 may be the same as that of the second housing 12, and the width of the first housing 11 is smaller than the width of the second housing 12 (wherein the width direction is the arrangement direction of the first probe assembly 30 and the second probe assembly 40). The cross-section of the first housing 11 and the second housing 12 may be T-shaped. The first cover 13 covers the surface of the first housing 11 away from the second housing 12, making the first housing 11 an enclosed space.

The magnetic member 20 is accommodate in the first housing 11 and may be attached to the surface of the first housing 11 near the first cover 13. The device to be measured includes a busbar with an iron outer frame. A magnetic force between the magnetic member 20 and the busbar allows the voltage measurement device 100 to be attached to any position on the busbar. This allows for flexible adjustment of the measurement position of the voltage measuring device 100. In some embodiments, the magnetic member 20 is a magnet. Furthermore, the magnet may be cubic with a length of 30 mm, a width of 10 mm, and a height of 5 mm.

The first probe assembly 30 is disposed in the second housing 12 and protrudes from the second housing 12. The first probe assembly 30 further passes through the first cover 13. In other words, a portion of the first probe assembly 30 is located inside the housing 10, while another portion of the first probe assembly 30 is located outside the housing 10. The first probe assembly 30 includes a first probe 31 and a first sleeve 32. A portion of the first probe 31 is accommodated (sleeved) within the first sleeve 32, and the remaining portion of the first probe 31 protrude from the first sleeve 32. As shown in FIG. 2, the portion of the first probe 31 located within the second housing 12 and the portion of the first probe 31 located between the second housing 12 and the first cover 13 may be sleeved within the first sleeve 32, while the portion of the first probe 31 protruding through the first cover 13 is exposed from the first sleeve 32. The portion of the first probe assembly 30 located between the second housing 12 and the first cover 13 is exposed outside the housing 10, allowing such portion to be connected to an oscilloscope (not shown). Thus, a user can observe voltage changes on the oscilloscope.

The second probe assembly 40 is disposed within the second housing 12 and protrudes from the second housing 12. The second probe assembly 40 further passes through the first cover 13. The second probe assembly 40 is spaced apart from the first probe assembly 30, and the arrangement direction of the first and second probe assemblies 30, 40 may be perpendicular to the arrangement direction of the first housing 11 and the second housing 12. The second probe assembly 40 includes a second probe 41 and a second sleeve 42. A portion of the second probe 41 is accommodated (sleeved) within the second sleeve 42, and the remaining portion of the second probe 41 protrude from the second sleeve 42. The polarity of the second probe 41 is opposite to the polarity of the first probe 31. In some embodiments, the first probe 31 is a positive probe, and the second probe 41 is a negative probe. In other embodiments, the first probe 31 is a negative probe, and the second probe 41 is a positive probe. As shown in FIG. 2, the portion of the second probe 41 located within the second housing 12 and the portion located between the second housing 12 and the first cover 13 may be sleeved within the second sleeve 42, while the portion protruding through the first cover 13 is exposed from the second sleeve 42. The portion of the second probe assembly 40 located between the second housing 12 and the first cover 13 is exposed outside the housing 10, allowing such portion to be connected to the oscilloscope.

As shown in FIG. 1, in some embodiments, the voltage measurement device 100 further includes a first insulation portion 131 and a second insulation portion 132. Both the first and second insulation portions 131, 132 are disposed on the surface of the first cover 13 away from the first housing 11, and both the first and second insulation portions 131, 132 may be designed as annular protrusion structures. The first probe assembly 30 protrudes from the first insulation portion 131, and the second probe assembly 40 protrudes through the second insulation portion 132. The first and second insulation portions 131, 132 are used to electrically isolate the probe assemblies from the outer frame (made of iron) of the busbar. The materials of the first and second insulation portions 131, 132 may be, but are not limited to, insulation materials such as polytetrafluoroethylene (PTFE) and polyethylene terephthalate (PTE).

In some embodiments, the first probe assembly 30 further includes a first elastic member (not shown), and the second probe assembly 40 further includes a second elastic member (not shown). The first elastic member may be disposed at the end of the first sleeve 32 away from the first cover 13, and the end of the first probe 31 away from the first cover 13 is connected to the first elastic member. The second elastic member may be disposed at the end of the second sleeve 42 away from the first cover 13, and the end of the second probe 41 away from the first cover 13 is connected to the second elastic member. The first and second elastic members can respectively make the contact between the first probe 31 and the second probe 41 with the busbar more stable. The first and second elastic members may be, but are not limited to, springs.

In some embodiments, as shown in FIGS. 1 and 2, the first probe 31 and the second probe 41 may be cylindrical. The diameter of the ends of the first probe 31 and the second probe 41 away from the second housing 12 can be enlarged to increase the contact area with the busbar.

In some embodiments, the material of the first sleeve 32 is conductive and may be the same as the material of the first probe 31. The material of the first probe 31 or the first sleeve 32 may be, but is not limited to, copper or gold.

In some embodiments, the material of the second sleeve 42 is conductive and may be the same as the material of the second probe 41. The material of the second probe 41 or the second sleeve 42 may be, but is not limited to, copper or gold.

The voltage measurement device 100 shown in FIGS. 1 and 2 has a fixed relative position between the first probe assembly 30 and the second probe assembly 40. The present application also provides a voltage measurement device 200 in which the first probe assembly 30 and the second probe assembly 40 can move relative to each other, as shown in FIG. 3.

Figure 3:
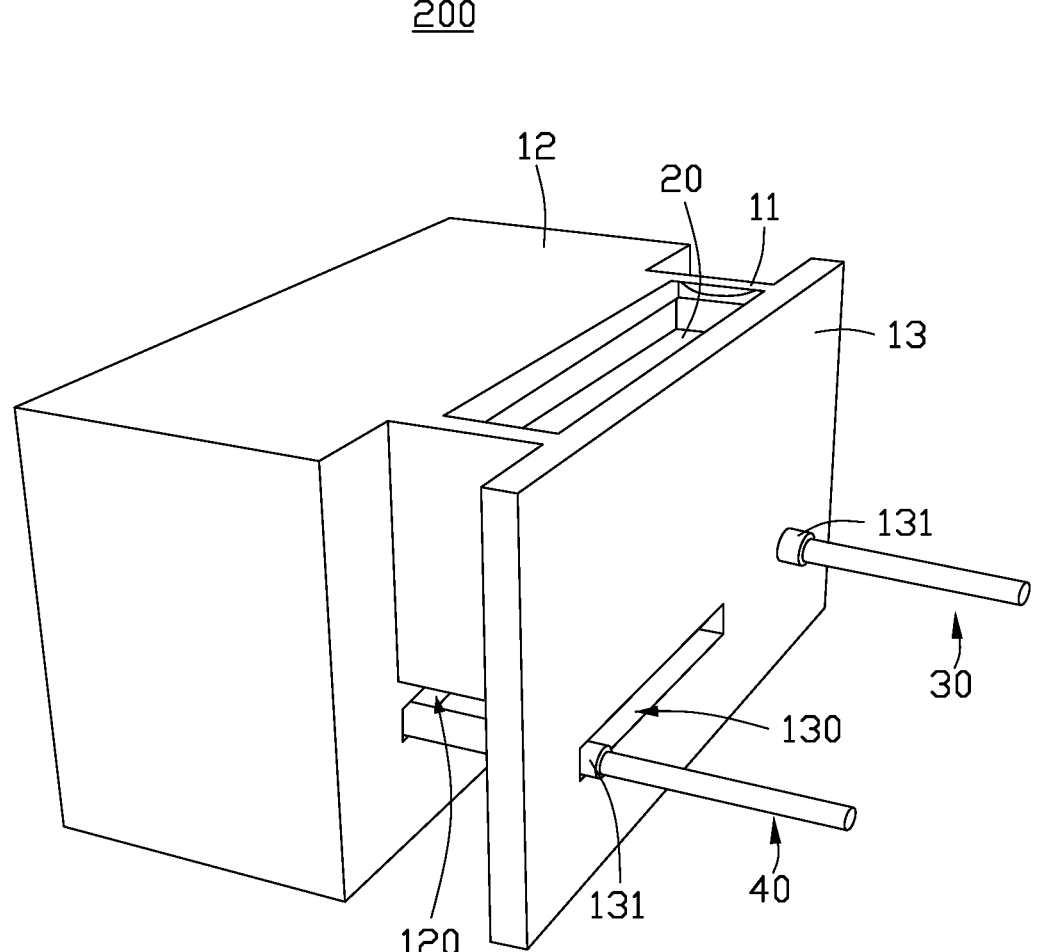
FIG. 3 is a diagrammatic view of another embodiment of a voltage measurement device according to the present disclosure.

The main differences between the voltage measurement device 200 shown in FIG. 3 and the voltage measurement device 100 shown in FIG. 1 are that the first cover 13 defines a first through slot 130 penetrating the first cover 13 along the thickness direction, the second housing 12 defines a second through slot 120 penetrating the surface of the second housing 12 near the first cover 13 along the thickness direction. The second through slot 120 corresponds to the first through slot 130. The second probe assembly 40 can move within the first through slot 130 and the second through slot 120 to approach or move away from the first probe assembly 30. Since the second probe assembly 40 is movable, the voltage measurement device 200 can measure the voltage of busbars with different thicknesses and measure the voltage of equipment with different volumes.

Furthermore, the extension direction of the first through slot 130 is parallel to the arrangement direction of the first probe assembly 30 and the second probe assembly 40, and the extension direction of the second through slot 120 is also parallel to the arrangement direction of the first probe assembly 30 and the second probe assembly 40.

As shown in FIG. 3, in some embodiments, the movable second probe 41 is a positive probe, and the fixed first probe 31 is a negative probe. In other embodiments, the movable second probe 41 is a negative probe, and the fixed first probe 31 is a positive probe.

As shown in FIG. 3, in some embodiments, the voltage measurement device 200 further includes a first insulation portion 131 disposed on the surface of the first cover 13 away from the first housing 11. The first insulation portion 131 may be designed as an annular protrusion structure, and the first probe assembly 30 protrudes from the first insulation portion 131. The first insulation portion 131 is used to electrically isolate the first probe assembly 30 from the outer frame (made of iron) of the busbar. The materials of the first insulation portion 131 may be, but are not limited to, insulation materials such as PTFE and PTE.

As shown in FIG. 3, in some embodiments, the second probe assembly 40 further includes an insulation layer 43 disposed on the surface of the portion of the second probe 41 that protrudes from the first cover 13. During the movement of the second probe assembly 40, the insulation layer 43 ensures insulation between the second probe assembly 40 and the outer frame (made of iron) of the busbar. The material may be, but is not limited to, insulating materials such as PTE. In some embodiments, the insulation layer 43 is referred to as a heat shrinkable tube.

Figure 4:
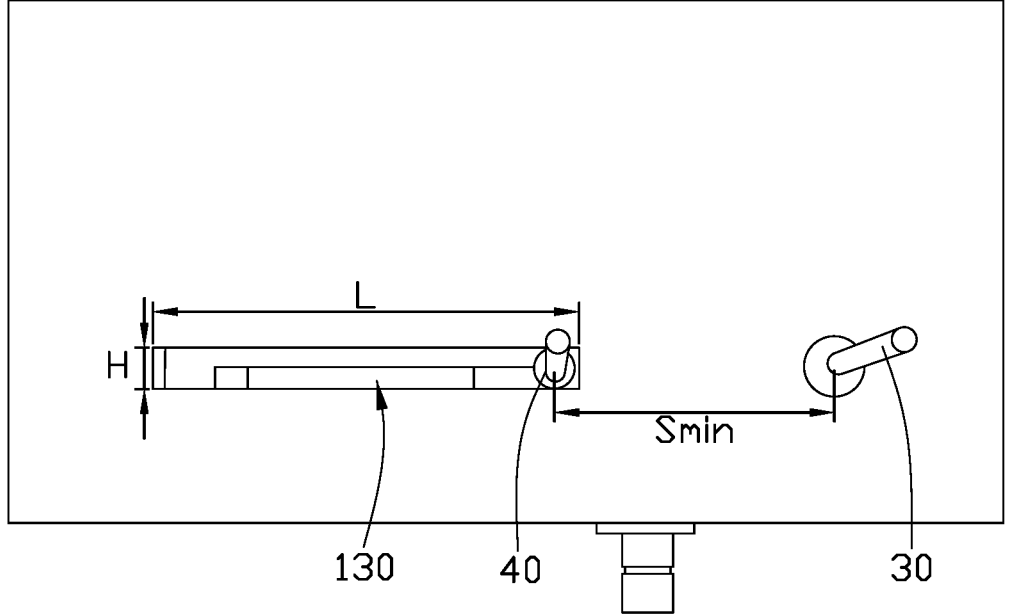
FIG. 4 is a diagrammatic view of a first probe assembly and a second probe assembly of the voltage measurement device of FIG. 3.
Figure 5:
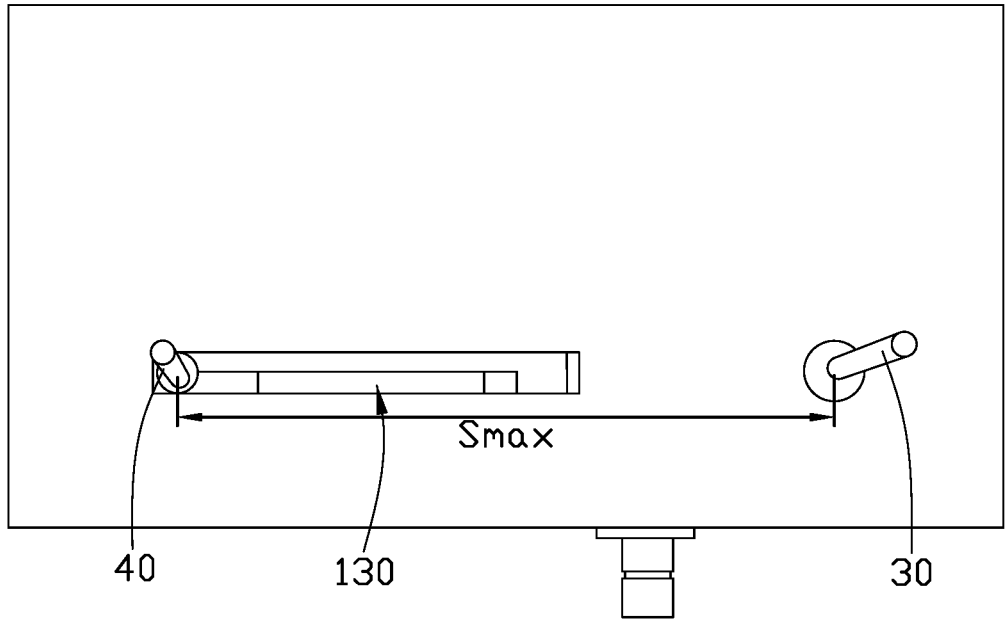
FIG. 5 is similar to FIG. 4, but showing the first probe assembly and the second probe assembly in a different state.

As shown in FIG. 4, in some embodiments, the minimum distance $S_{min}$ between the first probe assembly 30 and the second probe assembly 40 (i.e., the minimum distance between the central axis of the first probe 31 and the central axis of the second probe 41) may be 14 mm. Along the arrangement direction of the first probe assembly 30 and the second probe assembly 40, the length L of the first through slot 130 may be 22 mm, and the length of the second through slot 120 may also be 22 mm. The height H of the first through slot 130 may be 1.7 mm, and the height H of the second through slot 120 can may be 1.7 mm. As shown in FIG. 5, in some embodiments, the maximum distance $S_{max}$ between the first probe assembly 30 and the second probe assembly 40 (i.e., the maximum distance between the central axis of the first probe 31 and the central axis of the second probe 41) may be 36 mm.

Figure 6:
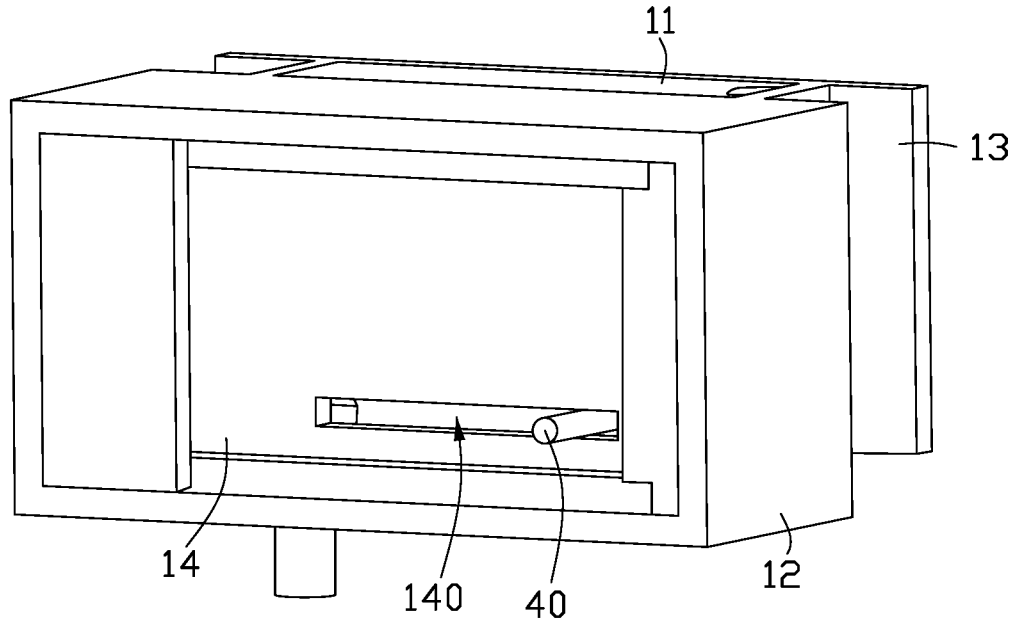
FIG. 6 is a diagrammatic view of the voltage measurement device of FIG. 3, viewed from another angle.

As shown in FIG. 6, in some embodiments, the housing 10 further includes a second cover 14 that covers the surface of the second housing 12 away from the first housing 11. The second cover 14 defines a third through slot 140 that passes through the second cover 14 along the thickness direction, and the third through slot 140 corresponds to the second through slot 120. One end of the second probe assembly 40 protrudes from the first through slot 130, and the other end of the second probe assembly 40 protrudes from the third through slot 140. The extension direction of the third through slot 140 is parallel to the arrangement direction of the first probe assembly 30 and the second probe assembly 40.

Figure 7:
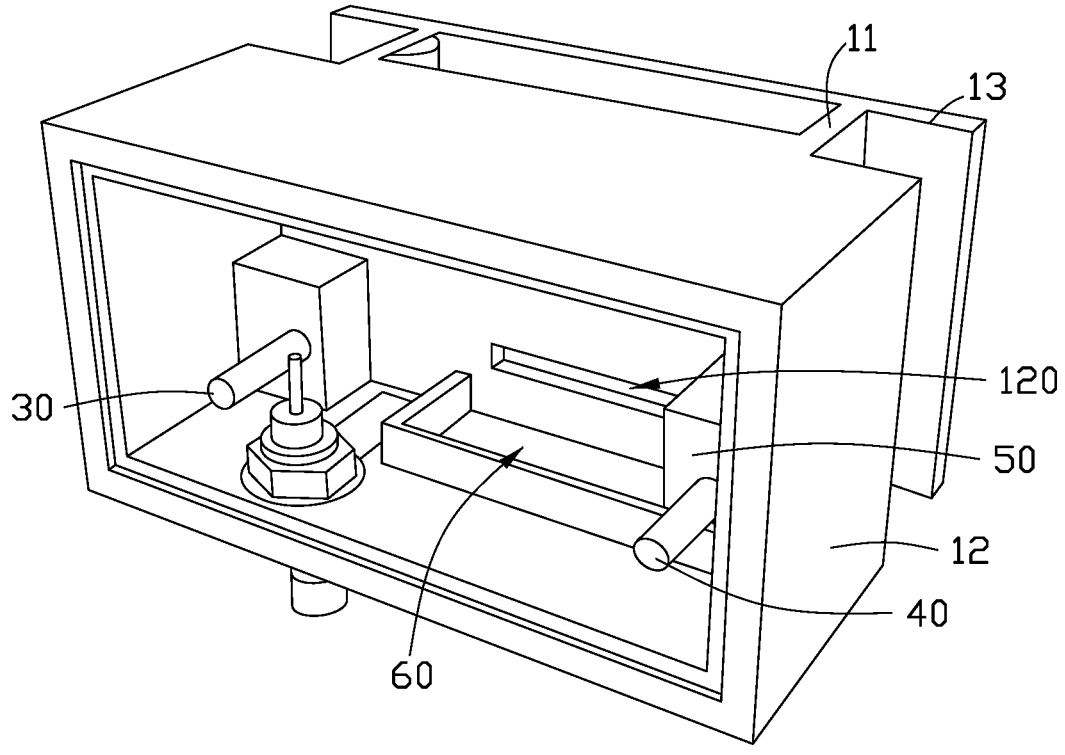
FIG. 7 is a diagrammatic view of an internal structure of the voltage measurement device of FIG. 3 in an embodiment.

As shown in FIG. 7, in some embodiments, the second housing 12 is provided with a slider 50 and a slide groove 60, and the slider 50 can move in the slide groove 60. The slider 50 is roughly cubic-shaped, and the slide groove 60 is disposed on the bottom wall of the second housing 12. The extension direction of the slide groove 60 is parallel to the extension direction of the second through slot 120. The second probe assembly 40 protrudes from the slider 50, and the movement of the slider 50 in the slide groove 60 can drive the movement of the second probe assembly 40 in the first through slot 130 and the second through slot 120.

Figure 8:
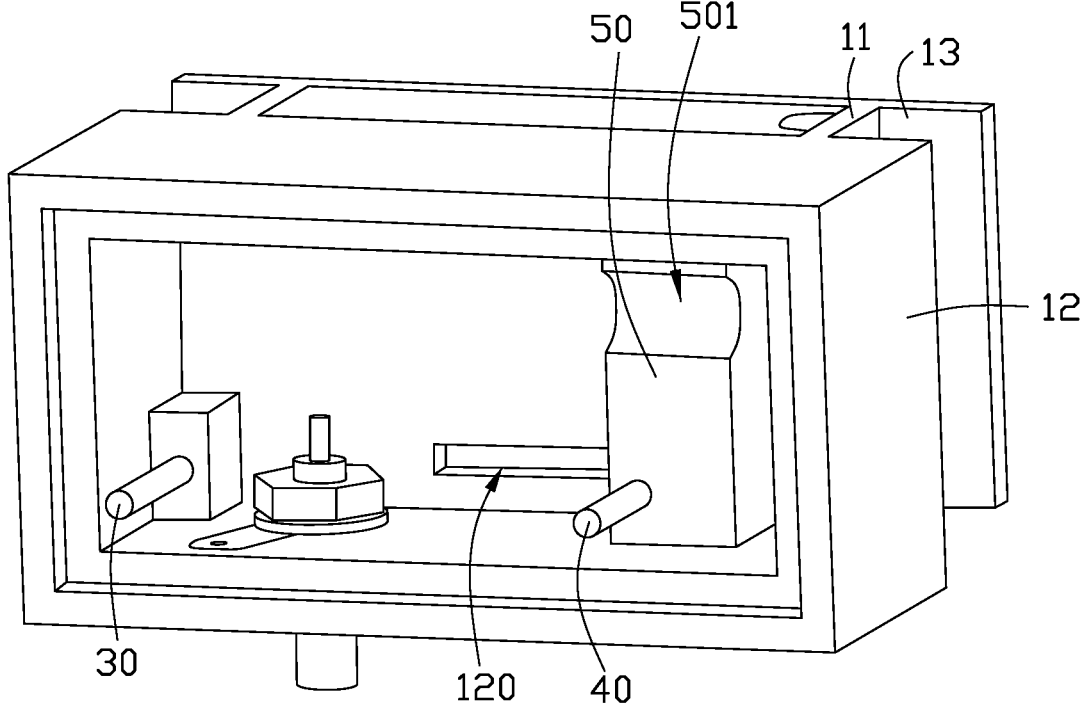
FIG. 8 is a diagrammatic view of another embodiment of an internal structure of the voltage measurement device of FIG. 3.
Figure 9:
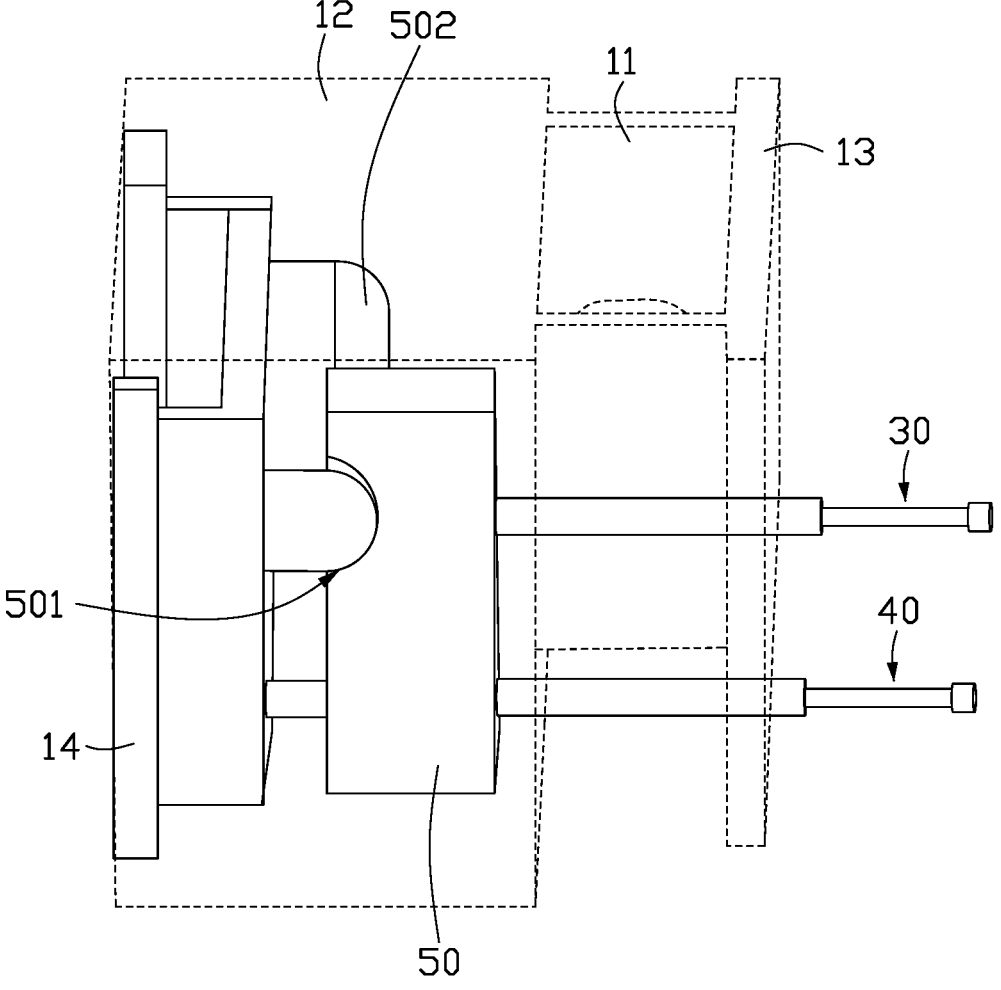
FIG. 9 is a perspective view of the voltage measurement device of FIG. 3.

As shown in FIGS. 8 and 9, in another embodiments, the second housing 12 is provided with a slider 50, and the slider 50 defines a recess 501. The second cover 14 is provided with a protrusion 502 that matches the recess 501. The slider 50 is roughly cubic-shaped, and the surface facing the protrusion 502 is partially recessed toward the first housing 11 to form the recess 501. The bottom wall of the recess 501 may be arcuate. The protrusion 502 protrudes from the surface of the second cover 14 near the first housing 11. The engagement of the recess 501 and the protrusion 502 allows the second probe assembly 40 to move in a straight line along the extension direction of the second through slot 120, preventing wobbling during movement of the second probe assembly 40.

By setting the magnetic member 20 within the housing 10, the voltage measurement device 100 (200) can be magnetically fixed to any position on the busbar of the device to be measured. This allows flexible adjustment of the measurement position of the voltage measurement device 100 (200). Additionally, the probe assemblies of the voltage measurement device 100 (200) can be connected to an oscilloscope to display voltage data changes, facilitating observation by the user. Furthermore, the voltage measurement device 200 includes the movable probe assembly, enabling voltage measurements on busbars of different thicknesses and devices of different sizes.

The above descriptions are some specific embodiments of the present application, but the actual application process cannot be limited only to these embodiments. For those of ordinary skill in the art, other modifications and changes made according to the technical concept of the present application should all belong to the protection scope of the present application.

What is claimed is:

1. A voltage measurement device comprising:
   a housing comprising a first housing, a second housing connected to the first housing, and a first cover covering the first housing;
   a magnetic member accommodated in the first housing;
   a first probe assembly arranged in the second housing and protruding from the second housing, the first probe assembly further extending through the first cover, wherein the first probe assembly comprises a first probe and a first sleeve, a portion of the first probe is sleeved within the first sleeve, and a portion of the first probe assembly which is between the second housing and the first cover is configured to be connected to an oscilloscope; and
   a second probe assembly arranged in the second housing and protruding from the second housing, the second probe assembly further extending through the first cover, wherein the second probe assembly comprises a second probe and a second sleeve, a portion of the second probe is sleeved within the second sleeve, a polarity of the second probe is opposite to a polarity of the first probe, and a portion of the second probe assembly which is between the second housing and the first cover is configured to be connected to the oscilloscope; the first cover defines a first through slot penetrating the first cover along a thickness direction of the first cover, the second housing defines a second through slot penetrating a surface of the second housing facing the first cover along a thickness direction of the second housing, the second through slot corresponds to the first through slot, and the second probe assembly is configured to move in the first through slot and the second through slot, the second cover defines a third through slot, an end of the second probe assembly protrudes from the first through slot, and an extension direction of the third through slot is parallel to an arrangement direction of the first probe assembly and the second probe assembly.

2. The voltage measurement device of claim 1, further comprising a first insulation portion arranged on a surface of the first cover away from the first housing, wherein the first probe assembly protrudes from the first insulation portion.

3. The voltage measurement device of claim 1, further comprising a second insulation portion arranged on a surface of the first cover away from the first housing, wherein the second probe assembly protrudes from the second insulation portion.

4. The voltage measurement device of claim 1, wherein the second probe assembly further comprises an insulation layer arranged on a surface of the portion of the second probe extending through the first cover.

5. The voltage measurement device of claim 1, wherein the second housing is provided with a slider and a slide groove, the second probe assembly protrudes from the slider, and the slider is configured to move in the slide groove.

6. The voltage measurement device of claim 1, wherein the housing further comprises a second cover covering the second housing, the second housing is provided with a slider, the slider defines a recess, and the second cover is provided with a protrusion engaged with the recess.

7. The voltage measurement device of claim 1, wherein an extension direction of the first through slot is parallel to an arrangement direction of the first probe assembly and the second probe assembly.

8. The voltage measurement device of claim 7, wherein along the arrangement direction of the first probe assembly and the second probe assembly, a length of the first through slot is 22 mm.

9. The voltage measurement device of claim 1, wherein an extension direction of the second through slot is parallel to an arrangement direction of the first probe assembly and the second probe assembly.

10. The voltage measurement device of claim 9, wherein along the arrangement direction of the first probe assembly and the second probe assembly, a length of the second through slot is 22 mm.

11. The voltage measurement device of claim 1, wherein a minimum distance between the first probe assembly and the second probe assembly is 14 mm.

12. The voltage measurement device of claim 1, wherein a maximum distance between the first probe assembly and the second probe assembly is 36 mm.

13. The voltage measurement device of claim 1, wherein along an arrangement direction of the first probe assembly and the second probe assembly, a width of the first housing is smaller than a width of the second housing.

14. The voltage measurement device of claim 1, wherein the magnetic member is a magnet, and the magnet is cubic with a length of 30 mm, a width of 10 mm, and a height of 5 mm.

15. The voltage measurement device of claim 1, wherein the first probe is a positive probe, and the second probe is a negative probe.

16. The voltage measurement device of claim 1, wherein the first probe is a negative probe, and the second probe is a positive probe.

17. The voltage measurement device of claim 1, wherein the first probe is made of copper or gold.

18. The voltage measurement device of claim 1, wherein the second probe is made of copper or gold.

\*  \*  \*  \*  \*